(12) United States Patent
Naji

(10) Patent No.: US 6,552,927 B2
(45) Date of Patent: Apr. 22, 2003

(54) MRAM ARCHITECTURE AND SYSTEM

(75) Inventor: Peter K. Naji, Gilbert, AZ (US)

(73) Assignee: Motorola, Inc., Schaumburg, IL (US)

(*) Notice: Subject to any disclaimer, the term of this patent is extended or adjusted under 35 U.S.C. 154(b) by 0 days.

(21) Appl. No.: 10/141,161

(22) Filed: May 8, 2002

(65) Prior Publication Data

US 2002/0131295 A1 Sep. 19, 2002

Related U.S. Application Data

(63) Continuation of application No. 09/772,669, filed on Jan. 30, 2001, now Pat. No. 6,418,046.

(51) Int. Cl.[7] .................................................. G11C 7/00
(52) U.S. Cl. ............. 365/158; 365/189.01; 365/189.09; 365/230.02
(58) Field of Search ........................ 365/189.01, 230.01, 365/230.02, 189.09, 158

(56) References Cited

U.S. PATENT DOCUMENTS

| 5,946,227 | A | | 8/1999 | Naji | |
| 5,986,925 | A | * | 11/1999 | Naji et al. | 365/158 |
| 6,055,178 | A | * | 4/2000 | Naji | 365/158 |
| 6,134,060 | A | | 10/2000 | Ryat | |
| 6,205,073 | B1 | * | 3/2001 | Naji | 365/209 |
| 6,272,040 | B1 | * | 8/2001 | Salter et al. | 365/158 |
| 6,331,943 | B1 | * | 12/2001 | Naji et al. | 365/158 |
| 6,385,109 | B1 | * | 5/2002 | Naji | 365/209 |
| 6,418,046 | B1 | * | 7/2002 | Naji | 365/158 |
| 6,424,562 | B1 | * | 7/2002 | Rosner et al. | 365/158 |
| 2002/0048185 | A1 | * | 4/2002 | Thewes et al. | 365/158 |
| 2002/0080644 | A1 | * | 6/2002 | Ito | 365/158 |
| 2002/0080661 | A1 | * | 6/2002 | Gogl et al. | 365/200 |
| 2002/0089024 | A1 | * | 7/2002 | Iwata | 257/421 |
| 2002/0097602 | A1 | * | 7/2002 | Lammers | 365/171 |

* cited by examiner

Primary Examiner—Viet Q. Nguyen
(74) Attorney, Agent, or Firm—Douglas W. Gilmore

(57) ABSTRACT

A magnetoresistive memory fabricated on a common substrate. The memory including first and second spaced apart magnetoresistive memory arrays each including a plurality of MTJ memory cells arranged in rows and columns and a plurality of word/digit lines associated with the rows of magnetoresistive memory cells of each of the arrays. Switching circuitry is positioned on the substrate between the first and second arrays and designed to select a word/digit line in one of the first and second arrays. A current source is positioned on the substrate adjacent and coupled to the switching circuitry for supplying programming current to the selected word/digit line.

4 Claims, 4 Drawing Sheets

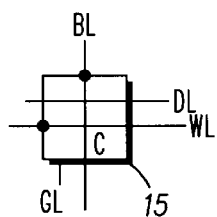
FIG. 2
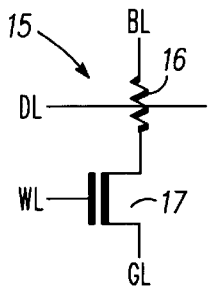
FIG. 3
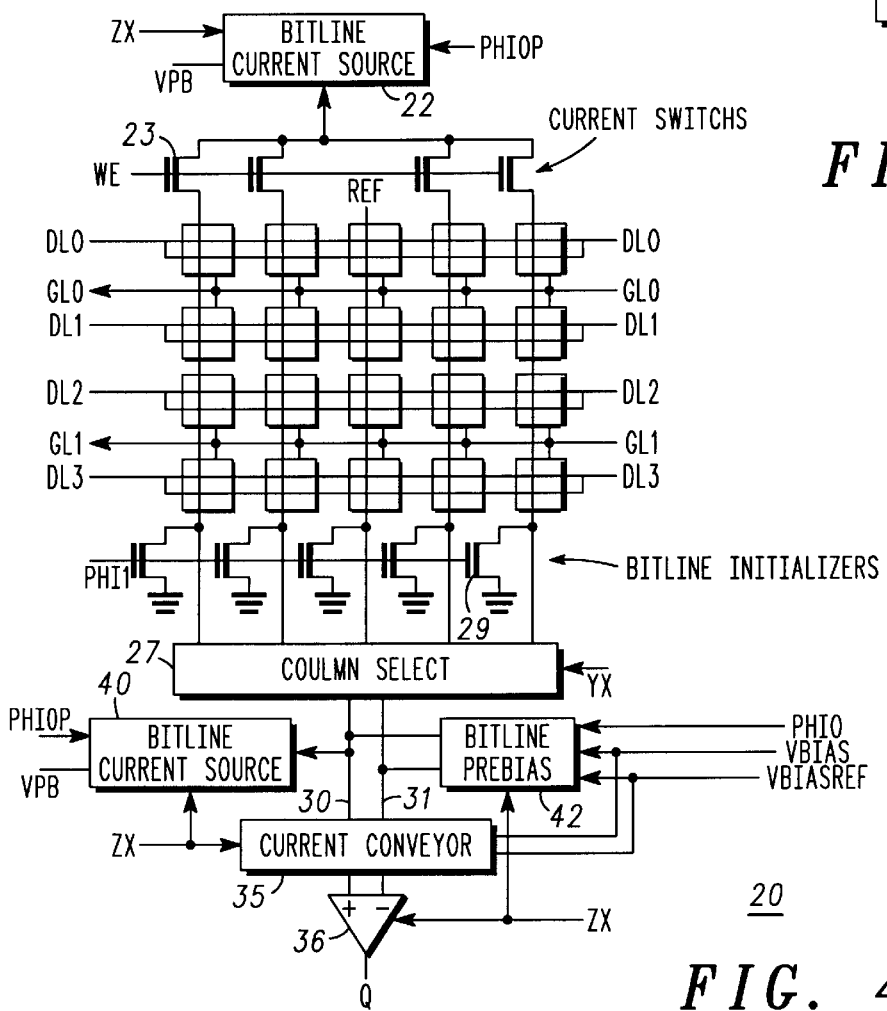
FIG. 4
FIG. 5

MRAM ARCHITECTURE AND SYSTEM

This application is a continuation of application Ser. No. 09/772,669, filed Jan. 30, 2001, now U.S. Pat. No. 6,418,046.

FIELD OF THE INVENTION

This invention relates to magnetoresistive random access memories and more particularly to the architecture of magnetoresistive random access memories systems.

BACKGROUND OF THE INVENTION

The architecture for Magnetoresistive Random Access Memory (MRAM) is generally composed of a plurality or array of memory cells and a plurality of digit and bit line intersections. The magnetoresistive memory cell generally used is a magnetic tunnel junction (MTJ), an isolation transistor, and the intersection of digit and bit lines. The isolation transistor is generally a N-channel field effect transistor (FET). An interconnect stack connects the isolation transistor to the MTJ device to the bit line. The digit line is used to create part of the magnetic field for programming the MRAM cell.

MTJ memory cells generally include a non-magnetic conductor forming a lower electrical contact, a pinned magnetic layer, a tunnel barrier layer positioned on the pinned layer, and a free magnetic layer positioned on the tunnel barrier layer with an upper contact on the free magnetic layer.

The pinned layer of magnetic material has a magnetic vector that is always pointed in the same direction. The magnetic vector of the free layer is free, but constrained by the physical size of the layer, to point in either of two directions. An MTJ cell is used by connecting it in a circuit such that electricity flows vertically through the cell from one of the layers to the other. The MTJ cell can be electrically represented as a resistor and the size of the resistance depends upon the orientation of the magnetic vectors. As is understood by those skilled in the art, the MTJ cell has a relatively high resistance when the magnetic vectors are misaligned (point in opposite directions) and a relatively low resistance when the magnetic vectors are aligned. Additional information as to the fabrication and operation of MTJ memory cells can be found in U.S. Pat. No. 5,702,831, entitled "Multi-Layer Magnetic Tunneling Junction Memory Cells", issued Mar. 31, 1998, and incorporated herein by reference.

A bit line is generally associated with each column of an array of MTJ cells and a digit line is associated with each row of the array. The bit lines and digit lines are used to address individual cells in the array for both reading and programming or storing information in the array. Programming of a selected cell is accomplished by passing predetermined currents through the digit and bit lines intersecting at the selected cell. The currents create a magnetic field that sets the magnetic vector in the free layer to a desired position. Several problems are prevalent in the standard memory architecture, including high programming currents, insufficient space on the substrate to conveniently carry all of the related components, and memory system timing to effectively utilize a memory cycle during read and program operations.

Thus, it is desirable to provide an improved architecture for MRAM memories that overcome some or all of these problems and an improved system of operation.

BRIEF DESCRIPTION OF THE DRAWINGS

Referring to the drawings:

FIG. 2 is a simplified block diagram of a cell of the memory of FIG. 1;

FIG. 3 is a schematic diagram of the cell of FIG. 2;

FIG. 4 is a simplified block diagram of a macro portion of the memory of FIG. 1;

FIG. 5 illustrates a representative block of the macro portion illustrated in FIG. 4;

DESCRIPTION OF THE PREFERRED EMBODIMENT

Figure 1:
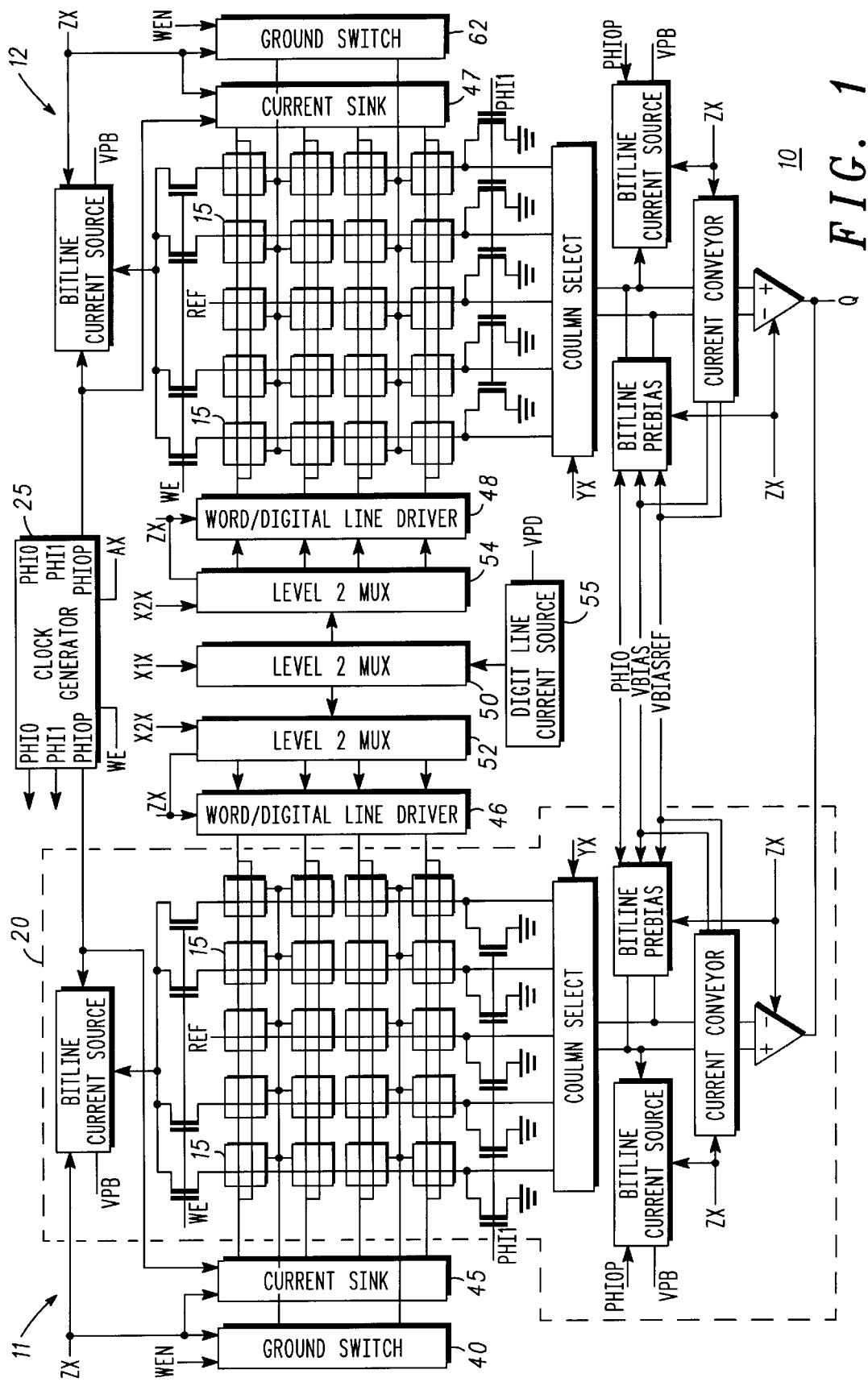
FIG. 1 is a simplified block diagram of a magnetoresistive memory in accordance with the present invention.

Referring to FIG. 1, a simplified block diagram is illustrated of a magnetoresistive memory 10 in accordance with the present invention. Memory 10 includes first and second spaced apart magnetoresistive memory banks or arrays 11 and 12, each of which includes a plurality of magnetoresistive memory cells 15 arranged in rows and columns. For convenience, memory 10 is referred to herein as an MRAM, which is defined as a Magnetoresistive Random Access Memory, and the individual memory cells 15 are preferably magnetic tunneling junction (MTJ) cells. For convenience of illustration, while it will be understood that a smaller or larger array could be used if desired, in this example each memory array 11 and 12 includes a 4×4 array of memory cells 15 arranged in four rows and five columns, with a central column in each array 11 and 12 serving as a reference column and the remaining four columns being "actual" or data storing columns.

For ease in understanding and illustration, an individual memory cell 15 is illustrated in block form in FIG. 2 and schematically in FIG. 3. Memory cell 15 includes a magnetic tunnel junction (MTJ), electrically represented as a resistor 16, an isolation transistor 17, and the intersection of an associated digit line (DL) and a bit line (BL). Generally, the information stored in memory cell 15 is read by supplying a read current to one end of resistor 16 and by grounding the source of transistor 17 through a ground line GL. A word line (WL) connects to the gate terminal of each isolation transistor 17 in a row of memory cells 15. Further, in the preferred embodiment, the word line WL, which is generally formed of polysilicon or the like, and the digit line DL, which is generally formed of metal, are electrically connected together (see FIG. 1) and will be referred to as a word/digit line in some instances. Additional information as to the fabrication and operation of MTJ memory cells can be found in U.S. Pat. No. 5,702,831, entitled "Multi-Layer Magnetic Tunneling Junction Memory Cells", issued Mar. 31, 1998, and incorporated herein by reference.

Figure 6:
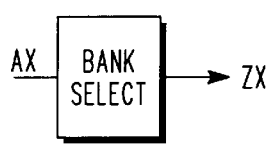
FIGS. 6, 7, 8, and 9 illustrate signal generating blocks of the magnetoresistive memory of FIG. 1.

Here it should be understood that portions of each of the arrays 11 and 12 (outlined by a broken line around array 11) are substantially similar and, accordingly, only array 11 will be explained in detail. The similar portion of the arrays (herein designated a macro portion 20) is illustrated separately in FIG. 4 and as a simplified block in FIG. 5. A bit line current source 22 is provided at the upper end of memory array 11 and a plurality of n-channel decoupling transistors 23 are positioned at the top of each column, except the reference column, to decouple or couple the bit line BL of each column with current source 22. The reference column does not get programmed and, therefore, does not receive program current from current source 22. Current source 22 is controlled by a timing signal $phi_{Op}$ from a clock generator 25 (see FIG. 1) and a bank or array select signal $Z_x$ (see FIG. 6), and is coupled to an external bias voltage $V_{pb}$ which sources the bit line current.

Figure 7:
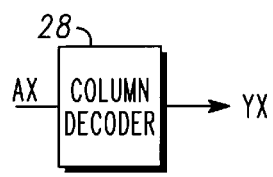

A column select circuit 27 positioned at the bottom of array 11 is connected to the opposite ends of bit lines BL and performs column selection duties as controlled by an output signal $Y_x$ of a column decode circuit 28, illustrated in FIG. 7. A series of n-channel transistors 29 are connected to bit lines BL, prior to the bit line BL connections to column select circuit 27. The drains of transistors 29 are connected one each to the bit lines BL and the sources are connected to ground. The gates of transistors 29 are connected to a timing signal $phi_1$ from clock generator 25 so that transistors 29 are responsible for initialization of bit lines BL.

Column select circuit 27 provides an actual or data output on a line 30 and a reference output on a line 31 to a current conveyor 35. Current conveyor 35 is included because it renders circuit operation and output signals independent of all process, supply, temperature, and MTJ resistance conditions and because voltage swings on bit lines BL are virtually eliminated so that the speed of the readout process is greatly increased. A current conveyor for readout of a magnetic tunneling junction memory cell is disclosed in a copending U.S. patent application entitled "Current Conveyor and Method For Readout of MTJ Memories", Ser. No. 09/540,794, filed Mar. 31, 2000, assigned to the same assignee, and incorporated herein by reference. The actual and reference currents are sensed by current conveyor 35 and converted to voltages which are supplied to the positive and negative inputs, respectively, of a comparator 36 that in turn supplies an output q. Current conveyor 35 and comparator 36 form the read circuit for macro portion 20.

A bit line current source 40 is provided at the lower end of memory array 11 and is coupled to line 30 of column select 27. Current source 40 is controlled by a timing signal $phi_{Op}$ from clock generator 25 and bank or array select signal $Z_x$, and is coupled to external bias voltage $V_{pb}$ which sources the bit line current. Top and bottom bit line current sources 22 and 40 (herein referred to as current source/sinks) are controlled to source or sink bi-directional bit line currents for programming of memory cells 15 and the duration of the current is controlled by timing signal $phi_{Op}$.

Also, a bit line prebias circuit 42 is connected to both lines 30 and 31 for prebiasing all data lines and only selected bit lines to a voltage $V_{bias}$ and the reference bit line to a voltage $V_{biasref}$ during a timing signal $phi_0$. Timing signal $phi_0$ is supplied to circuit 42 from clock generator 25, select signal $Z_x$ is supplied from the bank select, and the voltage signals $V_{bias}$ and $V_{biasref}$ are either generated on the chip or supplied from an external source.

Referring specifically to FIG. 1, each of the arrays 11 and 12 (or the macro portions 20) include four rows each with a word/digit line. One end of each of the word/digit lines of array 11 is connected to a current sink 45 and the other end is connected to a word/digit line driver 46. Both current sink 45 and driver 46 are activated (when selected) by the signal $Z_x$ from the bank select circuit. Also, the length of time that current sink 45 turns on is determined by the timing signal $phi_{Op}$ from clock generator 25. Similarly, the word/digit lines of array 12 are connected at one end to a current sink 47 and at the other end to a driver 48.

Figure 8:
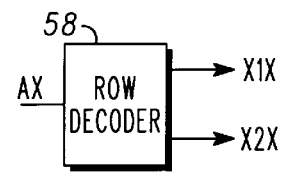

Two levels of multiplexers are provided for selecting between memory arrays 11 and 12 and for selecting the word/digit line of a specific row in the selected array. Outputs of a first level multiplexer 50 are connected to two second level multiplexers 52 and 54. The outputs of second level multiplexer 52 are connected to driver 46 and the outputs of second level multiplexer 54 are connected to driver 48. A current source 55, which is sourced by a bias voltage $V_{pd}$, is connected to supply current to first level multiplexer 50. A row decoder 58 (see FIG. 8) supplies a first control signal $X_{1x}$ to first level multiplexer 50 and a second control signal $X_{2x}$ to second level multiplexers 52 and 54 in response to the application of an address $A_x$.

In operation, first level multiplexer 50 directs current from current source 55 to a segment of second level multiplexers 52 and 54. The selected one of second level multiplexers 52 or 54 then directs the current to the word/digit line of a selected row of memory cells. Word/digit line current sourced by current source 55 is steered to a selected one of the macro portions 20 and flows through a selected word/digit line to the associated current sink 45 or 47. The current sinks 45 and 47 are controlled by timing signal $phi_{Op}$ and, therefore, the duration of $phi_{Op}$ controls the length of time which programming current flows in the selected word/digit line.

Here it should be specifically noted that current source 55 is located adjacent the two levels of multiplexers at the bottom center of memory 10. As will be understood by those skilled in the art from the present description, all of the structure and components described are intended in the preferred embodiment to be fabricated on a common substrate, generally a semiconductor chip. Because each macro portion 20 is formed as a common unit and because the two levels of multiplexing are generally located as close as possible to reduce lead lines, current source 55 is conveniently located at the bottom center, as described. Current source 55 plays an important role in memory 10, due to its location. The advantage is that one current source supplies word/digit line program current without having to replicate the current source for every word/digit line or groups of word/digit lines. Replication of word/digit line current sources would occupy a very large area of the substrate (semiconductor chip) due to the large size of the word/digit line current source.

In the present architecture of memory 10, current source 55 not only provides programming current during the program mode of operation, but also operates as a driver/pull-up in the read mode of operation. By simply turning off the current sinks 45 and 47 in the read mode, current source 55 becomes a driver/pull-up which pulls selected word/digit lines up to the supply voltage $V_{dd}$. Thus, current source 55 performs two different tasks during two different modes of operation, thereby, substantially reducing the number of components required.

A ground switch 60 is provided adjacent to current sink 45 and connects, or disconnects, the ground lines GL for each memory cell in array 11 to actual ground. A ground switch 62 is provide adjacent to current sink 47 and connects, or disconnects, the ground lines GL for each memory cell in array 12 to actual ground. Ground switches 60 and 62 connect the ground line GL for each memory cell to actual ground in the read mode of operation and disconnect them from ground in the program mode of operation.

Figure 9:
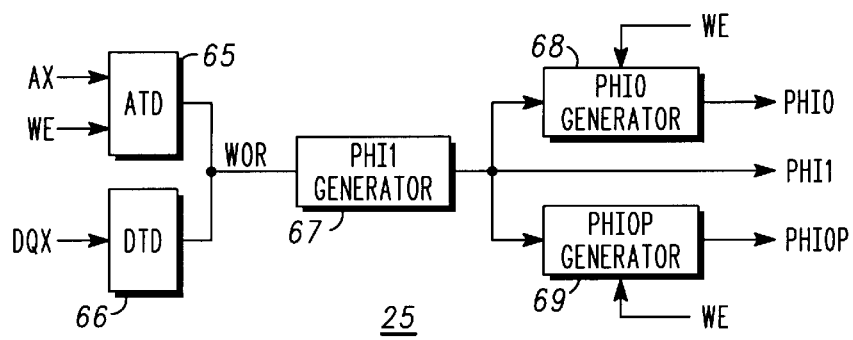

The system timing of memory 10 is governed by onboard clock generator 25, which generates all clock phases without the use of an onboard oscillator or an external crystal. Turning to FIG. 9, a more detailed block diagram of clock generator 25 is illustrated. In this embodiment, clock generator 25 includes an address transition detector (ATD) 65, a data transition detector (DTD) 66, a $phi_1$ generator 67, a $phi_0$ generator 68, and a $phi_{0p}$ generator 69. Write enable signals WE and addresses $A_x$ are supplied to ATD 65 and input data $DQ_x$ is supplied to DTD 66. The outputs of ATD 65 and DTD 66 are wire ORed into $phi_1$ generator 67. Upon an address $A_x$ or WE transition, ATD 65 responds with a narrow pulse at the output. In the same manner, DTD 66 responds to data $DQ_x$ transitions.

Upon receiving an ATD or DTD output signal, $phi_1$ generator 67 generates a $phi_1$ clock signal at the output. In the program mode of operation, the $phi_1$ clock signal is generated as a result of both address $A_x$ and/or data $DQ_x$ transitions, while in the read mode of operation only address transitions generate the $phi_1$ clock signal. Transitions of write enable signals WE at the beginning of either program or read modes will generate the $phi_1$ clock signal. The relationship of the various signals is illustrated in the timing diagram of FIG. 10.

Figure 10:
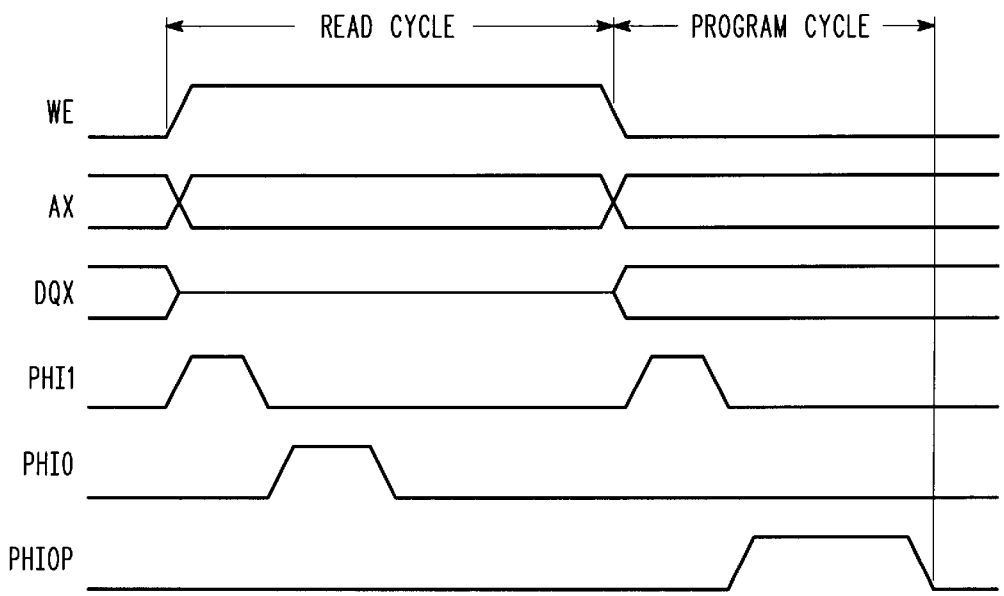
FIG. 10 is a timing chart for the various signals present in the magnetoresistive memory of FIG. 1.

Turning additionally to FIG. 10, a read cycle is illustrated as continuing from a rising write enable signal WE to a falling WE. At a later time, as will be explained below, the programming mode is initiated. Upon a low going edge of the $phi_1$ clock signal, a $phi_0$ clock signal is generated in the read mode and a $phi_{0p}$ clock signal is generated in the program mode. The following operations occur during the various clock signals. During $phi_1$ all bit lines BL are initialized to ground potential. During $phi_0$ in the read mode only selected bit lines BL in either array 11 or array 12 are prebiased to $V_{bias}$ which is the actual bit line clamp voltage. Also, during $phi_0$ all reference bit lines in either array 11 or array 12 are prebiased to $V_{biasref}$ which is the reference bit line clamp voltage. During $phi_{0p}$ word/digit lines and bit line program current flows through word/digit lines and bit lines respectively. Basically, $phi_{0p}$ controls the duration of the program cycle, except the time it takes to decode addresses and complete the word/digit line and bit line selection process.

The word/digit line and bit line selection process takes place during $phi_1$. During $phi_1$ all addresses are stable and all word/digit line and bit line selections are complete, and program current will start to flow on the rising edge of $phi_{0p}$. This clocking system has the distinct advantage that it prevents current from flowing into word/digit lines and bit lines which are in the process of de-selection. Current flowing into word/digit lines and bit lines which are in the process of de-selection may result in erroneous programming of incorrect memory locations.

Figure 11:
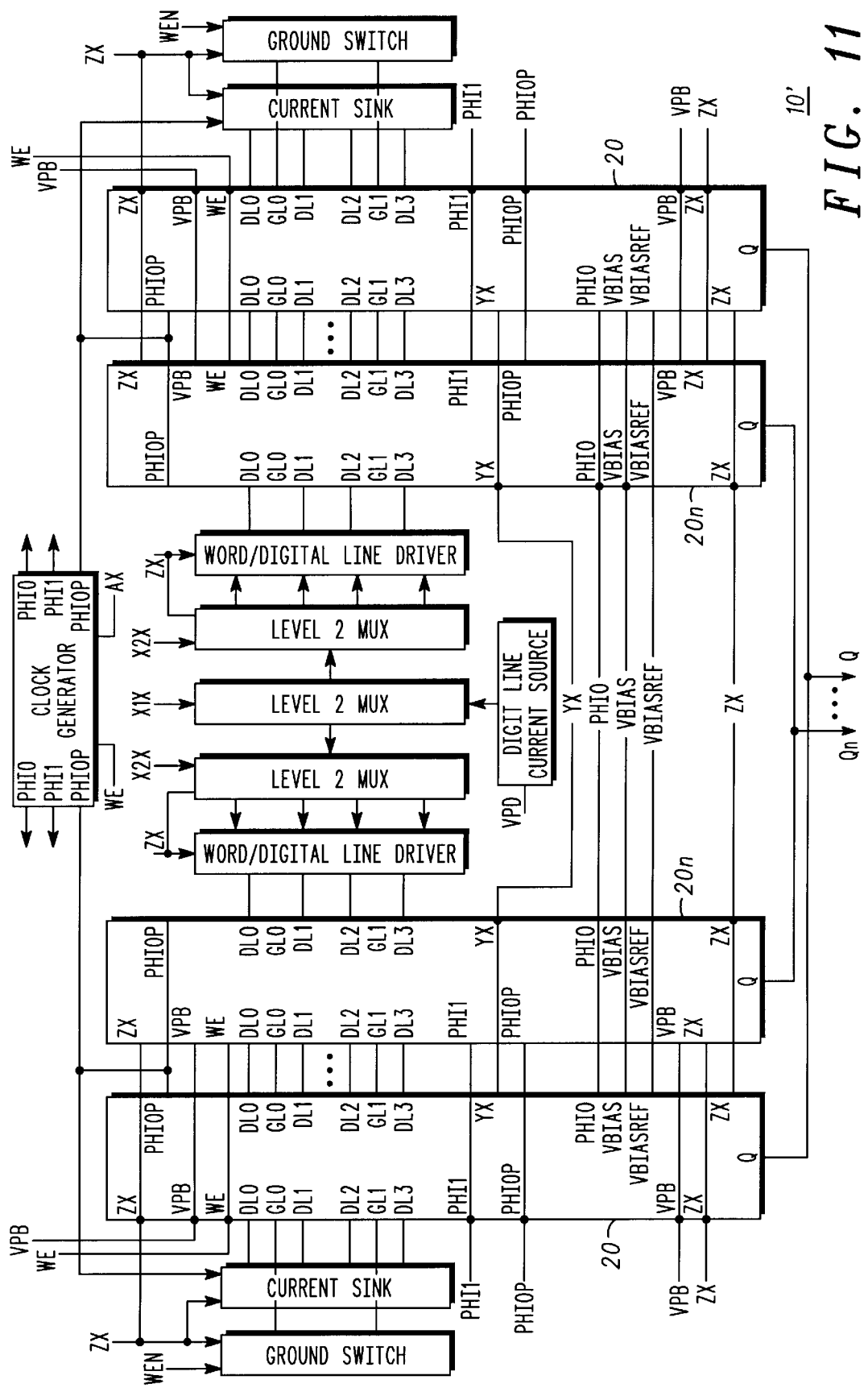
FIG. 11 is a block diagram of a magnetoresistive memory including a plurality of macro portions in accordance with the present invention.

In the above example, arrays 11 and 12 show a one bit wide memory. However, the arrays can easily be converted to a wider memory, i.e., a byte, a word, etc. For example, if n macro portions 20 are assembled on each side of the MRAM memory, any size MRAM memory can be fabricated, e.g., 8 bits, 16 bits, 32 bits, etc. Referring additionally to FIG. 11, a memory 10' is illustrated in which a plurality n pairs of macro portions 20 (designated 20 through $20_n$) are combined as described in conjunction with the architecture of FIG. 1. In memory 10' it can be seen that macro portions 20 provide an output Q with each additional pair providing an output up to the pair $20_n$ which provide an output $Q_n$. In this example, each pair of macro portions share all of the control circuits so that no additional circuitry is required, except for the inter connections of macro portions. It will of course be understood that the macro portions are described as operating in pairs but in some specific applications one or more single macro portions could be used individually.

Thus, a new and improved magnetoresistive memory architecture and system is disclosed which greatly reduces the complexity of manufacturing and operation. Further, a magnetoresistive random access memory is disclosed which includes a plurality or magnetic tunnel junction (MTJ) memory cells. Also, because of the novel architecture, the new and improved magnetoresistive memory can be fabricated as a stand alone component on a common substrate, such as a semiconductor chip.

While I have shown and described specific embodiments of the present invention, further modifications and improvements will occur to those skilled in the art. I desire it to be understood, therefore, that this invention is not limited to the particular forms shown and I intend in the appended claims to cover all modifications that do not depart from the spirit and scope of this invention.

What is claimed is:

1. A method of operating a magnetoresistive memory comprising the steps of:

providing a macro portion of a magnetoresistive memory including a plurality of magnetoresistive memory cells arranged in rows and columns, the memory array including a reference column of magnetoresistive memory cells, a plurality of word/digit lines one each magnetically associated with each row of magnetoresistive memory cells, a plurality of bit lines one each magnetically associated with each column of magnetoresistive memory cells, and first and second current source/sinks attached to opposite ends of each of the plurality of bit lines;

initializing all bit lines during a first time period and selecting a specific bit line and word/digit line during the first time period in response to the application of an address; and flowing program current through the selected word/digit lines and bit lines during a subsequent time period to store data in a magnetoresistive memory cell positioned at a junction of the selected bit line and word/digit line.

2. A method as claimed in claim 1 including a step of coupling the first and second current source/sinks to the selected bit line for flowing the program current through the selected bit line in a selected direction.

3. A method as claimed in claim 1 including steps of prebiasing all bit lines during a second time period subsequent to the first time period and different than the subsequent time period, and reading data stored in a magnetoresistive memory cell positioned at a junction of the selected bit line and word/digit line subsequent to the first and second time periods and different than the subsequent time period.

4. A method as claimed in claim 3 including a step of coupling a ground to at least the magnetoresistive memory cell positioned at the junction of the selected bit line and word/digit line prior to the step of reading data.

* * * * *

UNITED STATES PATENT AND TRADEMARK OFFICE
CERTIFICATE OF CORRECTION

PATENT NO.    : 6,552,927 B2
DATED         : April 22, 2003
INVENTOR(S)   : Naji It is certified that error appears in the above-identified patent and that said Letters Patent is hereby corrected as shown below:

<u>Column 1,</u>
Line 2, please add as a new first paragraph the following paragraph:

-- This invention was made with Government support under Agreement No. MDA972-96-3-0016 awarded by DARPA. The Government has certain rights in the invention. --

Signed and Sealed this

Sixteenth Day of September, 2003

JAMES E. ROGAN
*Director of the United States Patent and Trademark Office*